United States Patent
Shimizu et al.

(10) Patent No.: US 9,490,327 B2
(45) Date of Patent: Nov. 8, 2016

(54) SEMICONDUCTOR DEVICE AND METHOD OF MANUFACTURING THE SAME

(71) Applicant: Kabushiki Kaisha Toshiba, Minato-ku (JP)

(72) Inventors: Tatsuo Shimizu, Shinagawa (JP); Ryosuke Iijima, Setagaya (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 19 days.

(21) Appl. No.: 14/619,595

(22) Filed: Feb. 11, 2015

(65) Prior Publication Data
US 2015/0236099 A1 Aug. 20, 2015

(30) Foreign Application Priority Data
Feb. 17, 2014 (JP) ................................ 2014-027937

(51) Int. Cl.
| H01L 29/15 | (2006.01) |
|---|---|
| H01L 29/16 | (2006.01) |
| H01L 29/08 | (2006.01) |
| H01L 29/66 | (2006.01) |
| H01L 29/78 | (2006.01) |
| H01L 21/223 | (2006.01) |

(52) U.S. Cl.
CPC ......... *H01L 29/1608* (2013.01); *H01L 21/223* (2013.01); *H01L 29/0847* (2013.01); *H01L 29/66068* (2013.01); *H01L 29/7833* (2013.01)

(58) Field of Classification Search
CPC .............................. H01L 29/78; H01L 21/336
USPC .......................................................... 257/77
See application file for complete search history.

(56) References Cited

U.S. PATENT DOCUMENTS

| 7,517,807 B1 | 4/2009 | Tucker et al. |
| 2007/0187756 A1 | 8/2007 | Snyder |
| 2010/0059819 A1 | 3/2010 | Snyder |

(Continued)

FOREIGN PATENT DOCUMENTS

| JP | 2000-150875 | 5/2000 |
| JP | 2012-186324 | 9/2012 |
| JP | 2015-153960 | 8/2015 |

OTHER PUBLICATIONS

Extended European Search Report issued Jun. 19, 2015 in Patent Application No. 15153076.3.

(Continued)

*Primary Examiner* — Steven Loke
*Assistant Examiner* — Samuel Park
(74) *Attorney, Agent, or Firm* — Oblon, McClelland, Maier & Neustadt, L.L.P

(57) ABSTRACT

A semiconductor device according to an embodiment includes: a semiconductor substrate; an n-type SiC layer provided on one side of the semiconductor substrate; a p-type first SiC region provided in the n-type SiC layer; a metallic second SiC region provided in the p-type first SiC region, the second SiC region containing at least one element selected from the group of Mg, Ca, Sr, Ba, Sc, Y, La, and lanthanoid; a gate electrode; a gate insulating film provided between the gate electrode and the n-type SiC layer, the gate insulating film provided between the gate electrode and the first SiC region; a first electrode provided on the second SiC region; and a second electrode provided on a side of the semiconductor substrate opposite to the n-type SiC layer.

12 Claims, 15 Drawing Sheets

(56) References Cited

U.S. PATENT DOCUMENTS

| | | | |
|---|---|---|---|
| 2012/0126311 A1 | 5/2012 | Snyder | |
| 2012/0228630 A1* | 9/2012 | Shimizu | H01L 29/167 257/77 |
| 2013/0328062 A1 | 12/2013 | Hisamoto et al. | |
| 2015/0236098 A1 | 8/2015 | Shimizu et al. | |

OTHER PUBLICATIONS

M.B. Scott et al., "Deep Level Defect Study of Ion Implanted (Ar, Mg, Cr) n-Type 6H-SiC by Deep Level Transient Spectroscopy", Materials Science Forum, vol. 264-268, XP-055195007, Feb. 1, 1998, pp. 549-552.

Hisayoshi Itoh et al., "Positron Annihilation Studies of Defects in 3C-SiC Hot-implanted with Nitrogen and Aluminum Ions", Appl. Phys., XP-055194970, May 6, 1997, pp. 315-323.

U.S. Appl. No. 14/619,306, filed Feb. 11, 2015, Shimizu, et al.

John M. Larson, et al., "Overview and Status of Metal S/D Schottky-Barrier MOSFET Technology", IEEE Transactions on Electron Devices, vol. 53, No. 5, May 2006, pp. 1048-1058.

Tatsuya Morine, et al., "Characterization of Mg-Implanted 4H-SiC layers", The $60^{th}$ JSAP Spring Meeting, 28p-G22-11, 2013, 1 page.

Hideharu Matsuura, et al., "Electrical Properties of Mg-Implanted 4H-SiC", Materials Science Forum, Vols. 778-780, 2014, pp. 685-688.

\* cited by examiner

FIG.9A  OFF STATE
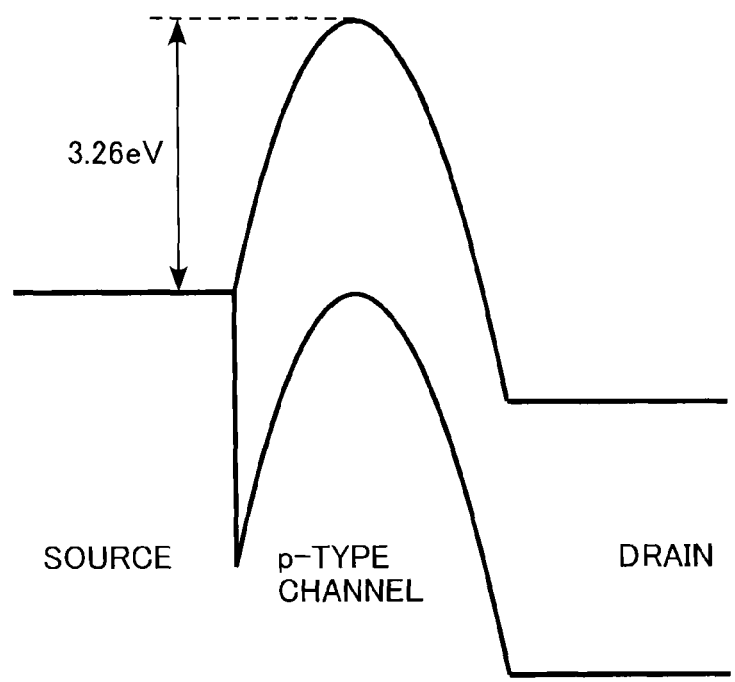
3.26eV
SOURCE   p-TYPE CHANNEL   DRAIN
FIG.9B  ON STATE
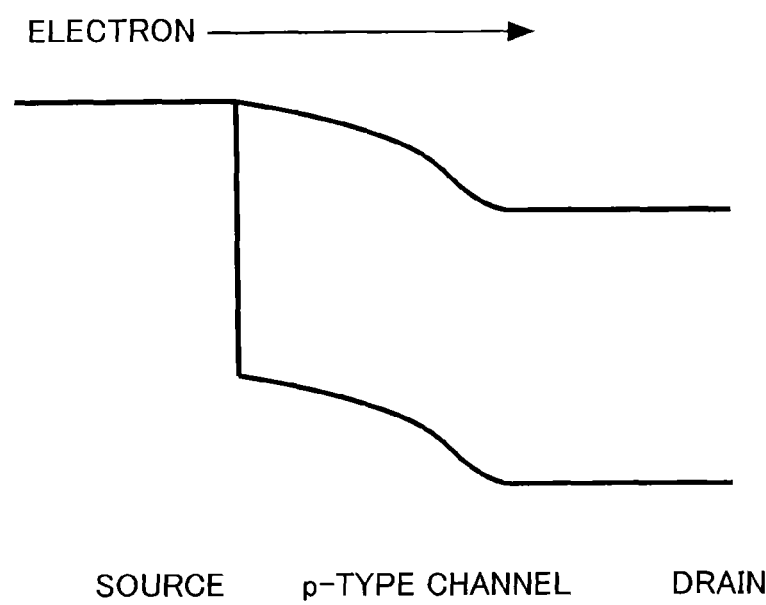
ELECTRON →
SOURCE   p-TYPE CHANNEL   DRAIN

US 9,490,327 B2

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2014-027937, filed on Feb. 17, 2014, the entire contents of which are incorporated herein by reference.

FIELD

Embodiments described herein relate generally to a semiconductor device and a method of manufacturing the same.

BACKGROUND

SiC (silicon carbide) has been expected as a material for next-generation semiconductor devices. SiC has excellent properties: bandgap which is three times as large; breakdown field strength which is about ten times as high; and thermal conductivity which is about three times as high, as compared with Si (silicon). The utilization of the characteristics can achieve semiconductor devices that are low in loss and able to operate at high temperatures.

As in MOSFETs (Metal Oxide Semiconductors) and IGBTs (Insulated Gate Bipolar Transistors), it is important to reduce the ON resistance in a semiconductor device including a MOS structure. One of the ways to reduce the ON resistance is to metallize a source region (emitter region) to reduce the parasitic resistance of the source region (emitter region).

In metallizing the source region (emitter region), the reduced barrier against electrons between the source region (emitter region) and a channel region in an ON state is required for the reduction in ON resistance. However, as compared with Si, SiC has a larger bandgap, and smaller potential energy (corresponding to electron affinity) measured from a vacuum level at the lower end of the conduction band. For this reason, there is considered to be no appropriate metallic materials which have such a work function that lowers the barrier between the source region (emitter region) and the channel region. Therefore, it is difficult to adopt a device structure with a source region (emitter region) metallized, as compared with cases of Si.

BRIEF DESCRIPTION OF THE DRAWINGS

FIGS. 9A and 9B are diagrams illustrating a function of the first embodiment;

DETAILED DESCRIPTION

Figure 1:
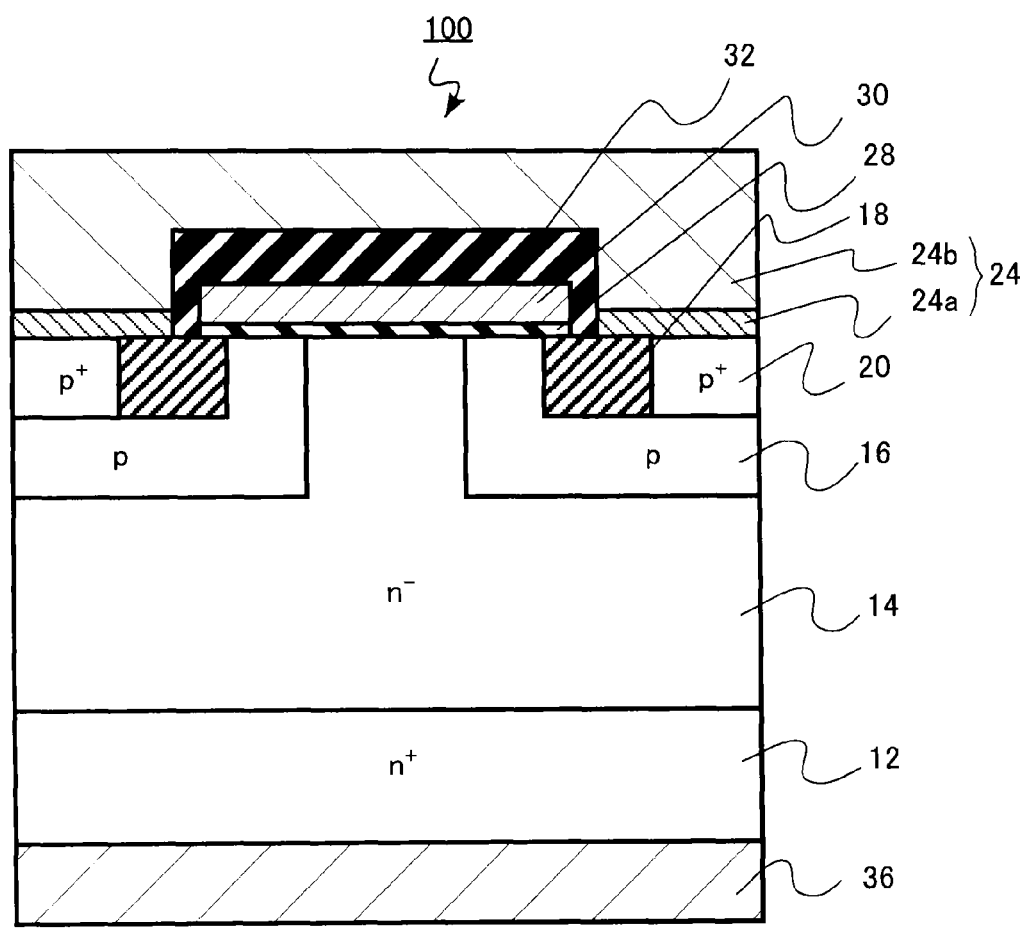
FIG. 1 is a schematic cross-sectional view illustrating a semiconductor device according to a first embodiment.

A semiconductor device according to an embodiment includes: a semiconductor substrate; an n-type SiC layer provided on one side of the semiconductor substrate; a p-type first SiC region provided in the n-type SiC layer; a metallic second SiC region provided in the p-type first SiC region, the second SiC region containing at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu); a gate electrode; a gate insulating film provided between the gate electrode and the n-type SiC layer, the gate insulating film provided between the gate electrode and the first SiC region; a first electrode provided on the second SiC region; and a second electrode provided on a side of the semiconductor substrate opposite to the n-type SiC layer.

Embodiments of the present disclosure will be described below with reference to the drawings. It is to be noted that the same parts or members, etc. will be denoted by the same reference numerals in the following description, and descriptions of the members, etc. described once will be appropriately omitted.

In addition, the expressions of $n^+$, n, and $n^-$, and $p^+$ p, and $p^-$ in the following description indicate relative levels of impurity concentrations for each conductivity type. More specifically, the expression $n^+$ indicates a relatively higher level of n-type impurity concentration than the expression n, whereas the $n^-$ indicates a relatively lower level of n-type impurity concentration than the expression n. Furthermore, the expression $p^+$ indicates a relatively higher level of p-type impurity concentration than the expression p, whereas the $p^-$ indicates a relatively lower level of p-type impurity concentration than the expression p. It is to be noted that in some cases, the n+ type and the n− type are simply referred to as an n type, whereas the p+ type and the p− type are simply referred to as a p type.

First Embodiment

The semiconductor device according to the present embodiment includes: a semiconductor substrate; an n-type SiC layer provided on one side of the semiconductor substrate; a p-type first SiC region provided over the semiconductor substrate with the n-type SiC layer interposed therebetween; a metallic second SiC region in contact with the first SiC region, the second SiC region provided over the n-type SiC layer with the first SiC region interposed therebetween, the second SiC region containing at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu); a gate electrode provided over the n-type SiC layer and the first SiC region with a gate insulating film interposed therebetween; a first electrode provided on the second SiC region; and a second electrode provided on a side of the semiconductor substrate opposite to the n-type SiC layer.

The device further includes a p-type third SiC region in contact with the first SiC region, the third SiC region provided over the n-type SiC layer with the first SiC region interposed therebetween, and the first electrode is provided on the third SiC region.

FIG. 1 is a schematic cross-sectional view illustrating the configuration of a MOSFET that is an example of semiconductor device according to the present embodiment. This MOSFET (Metal Oxide Semiconductor Field Effect Transistor) 100 is, for example, a Double Implantation MOSFET (DIMOSFET) which has a p well and a source region formed by ion implantation. In FIG. 1, a first surface refers to an upper surface in the figure, whereas a second surface refers to a lower surface in the figure.

This MOSFET 100 includes a SiC substrate (semiconductor substrate) 12 of n+-type semiconductor, which has the first and second surfaces. This SiC substrate 12 is, for example, a SiC substrate of 4H—SiC, which contains, for example, N (nitrogen) as an n-type impurity at an impurity concentration of $1 \times 10^{18}$ cm$^{-3}$ or more and $1 \times 10^{20}$ cm$^{-3}$ or less.

On the first surface of the SiC substrate 12, an n− type SiC layer (drift layer) 14 is formed which has, for example, an n-type impurity at an impurity concentration of $5 \times 10^{15}$ cm$^{-3}$ or more and $2 \times 10^{16}$ cm$^{-3}$ or less. The drift layer 14 has a film thickness of, for example, 5 μm or more and 50 μm or less.

On a partial surface of the drift layer 14, a p-type first SiC region (p well region) 16 is formed which has, for example, a p-type impurity at an impurity concentration of $5 \times 10^{15}$ cm$^{-3}$ or more and $1 \times 10^{17}$ cm$^{-3}$ or less. The p-type first SiC region (p well region) 16 is in contact with the drift layer 14.

The p well region 16 has a depth, for example, on the order of 0.6 μm. The p well region 16 functions as a channel region of the MOSFET 100.

On a partial surface of the p well region 16, a metallic second SiC region (source region) 18 is formed which contains at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu). The source region 18 is in contact with the p well region 16.

The source region 18 has a depth, for example, on the order of 0.3 μm, which is shallower than the depth of the p well region 16.

Furthermore, on a partial surface of the p well region 16 and a side surface of the source region 18, a p+-type third SiC region (p well contact region) 20 is formed which has, for example, a p-type impurity at an impurity concentration of $1 \times 10^{18}$ cm$^{-3}$ or more and $1 \times 10^{22}$ cm$^{-3}$ or less. The p well contact region 20 is in contact with the p well region 16. The p well contact region 20 has a depth, for example, approximately 0.3 μm, which is shallower than the depth of the p well region 16.

The MOSFET has a gate insulating film 28 formed continuously on the surfaces of the drift layer 14 and p well region 16 so as to cover the layer and the region. The gate insulating film 28 is in contact with the drift layer 14 and the p well region 16. For example, a SiO$_2$ film or a high-k insulating film is applicable to the gate insulating film 28.

Further, a gate electrode 30 is formed over the drift layer 14, the p well region 16, and the source region 18, with the gate insulating film 28 interposed therebetween. The gate electrode 30 is formed on the gate insulating film 28. For example, polysilicon or the like is applicable to the gate electrode 30. An interlayer insulating film 32 formed of, for example, a SiO$_2$ film is formed on the gate electrode 30.

A portion of the p well region 16 sandwiched between the source region 18 and drift layer 14 under the gate electrode functions as a channel region of the MOSFET 100.

Further, on the source region 18 and the p well contact region 20, a conductive source electrode (first electrode) 24 is provided which is electrically connected to the source region 18 and the p well contact region 20. The source electrode 24 also functions as a p well electrode that imparts an electric potential to the p well region 16.

The source electrode 24 is composed of, for example, a Ti (titanium) barrier metal layer 24a and an Al (aluminum) metal layer 24b on the barrier metal layer 24a. The Ti barrier metal layer 24a and the Al metal layer 24b may react to form an alloy.

Furthermore, a conductive drain electrode (second electrode) 36 is formed on the side of the SiC substrate 12 opposite to the drift layer 14, that is, on the second surface. The drain electrode 36 is electrically connected to the SiC substrate 12.

The drain electrode 36 is, for example, Ni (nickel). The drain electrode 36 has a film thickness of, for example, 1 μm or more and 10 μm or less.

It is to be noted that while the n-type impurity is preferably, for example, N (nitrogen) or P (phosphorus) in the present embodiment, it is also possible to apply As (arsenic), Sb (antimony), and the like. Further, while the p-type impurity is preferably, for example, Al (aluminum), it is also possible to apply B (boron), Ga (gallium), In (indium), and the like.

Next, a method will be described for manufacturing the semiconductor device according to the present embodiment.

In the method for manufacturing the semiconductor device according to the present embodiment, an n-type SiC layer is formed on one side of a semiconductor substrate, the SiC layer is subjected to ion implantation with a p-type impurity to form a p-type first SiC region, a gate insulating film is formed on the n-type SiC layer and the first SiC region, a gate electrode to be provided on the gate insulating film is formed, the first SiC region is subjected to ion implantation with at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu), after the ion implantation with the element, heat treatment is carried out to metallize the first SiC region with the element implanted therein, thereby forming a second SiC region, a first electrode is formed on the second SiC region, and a second electrode is formed on a side of the semiconductor substrate opposite to the n-type SiC layer.

Furthermore, in the method for manufacturing the semiconductor device according to the present embodiment, prior to the ion implantation with the element, the first SiC region is subjected to ion implantation with a p-type impurity to form a p-type third SiC region. Then, the first electrode is formed on the third SiC region.

In addition, after the ion implantation for forming the p-type third SiC region, high-temperature heat treatment (first heat treatment or high-temperature anneal) is carried out before the ion implantation with the element. Then, the above-mentioned heat treatment after the ion implantation with the element is carried out at a lower temperature than that for the high-temperature heat treatment. This heat treatment is referred to as low-temperature heat treatment (second heat treatment or low-temperature anneal).

Figure 2:
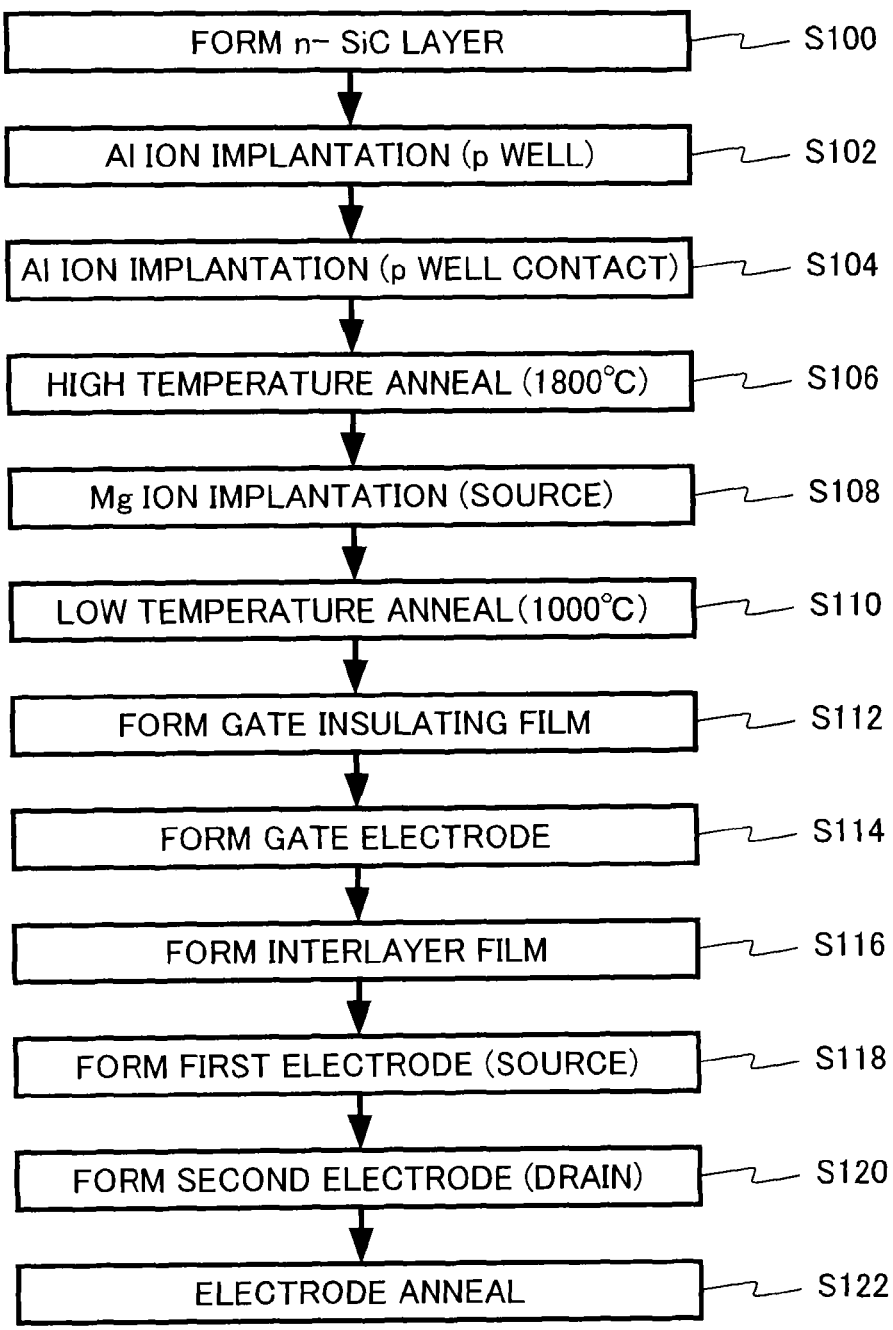
FIG. 2 is a process flow diagram illustrating by example a method for manufacturing the semiconductor device according to the first embodiment.

FIG. 2 is a process flow diagram illustrating by example a method for manufacturing the semiconductor device according to the present embodiment. FIGS. 3 to 7 are schematic cross-sectional views illustrating semiconductor devices in process of manufacture in the method for manufacturing the semiconductor device according to the present embodiment.

As shown in FIG. 2, the method for manufacturing the semiconductor device includes n⁻ SiC layer formation (step S100), Al ion implantation (step S102), Al ion implantation (step S104), high-temperature anneal (step S106), Mg ion implantation (step S108), low-temperature anneal (step S110), gate insulating film formation (step S112), gate electrode formation (step S114), interlayer film formation (step S116), first electrode formation (step S118), second electrode formation (step S120), and electrode anneal (step S122).

First, the low-resistance n⁺-type SiC substrate 12 of 4H—SiC is prepared which contains P (phosphorus) or N (nitrogen) as an n-type impurity at an impurity concentration on the order of $5 \times 10^{18}$ cm$^{-3}$, and has, for example, a thickness of 350 μm.

In step S100, the high-resistance n⁻ SiC layer (n-type SiC layer) 14 on the order of 10 μm in thickness, which contains, as an n-type impurity, for example, N at an impurity concentration on the order of $1 \times 10^{16}$ cm$^{-3}$, is epitaxially grown by an epitaxial growth method on one surface of the SiC substrate 12.

Figure 3:
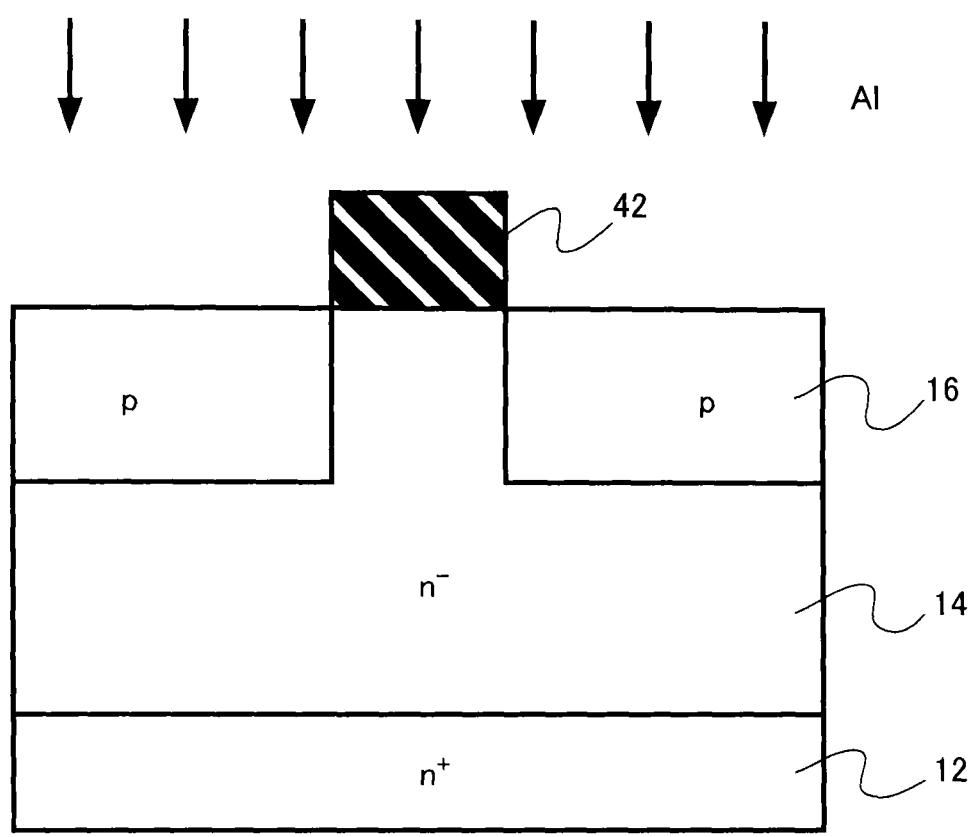
FIG. 3 is a schematic cross-sectional view illustrating a semiconductor device in process of manufacture in the method for manufacturing the semiconductor device according to the first embodiment.

Thereafter, a first mask material 42 of, for example, SiO$_2$ is formed by patterning through photolithography and etching. In step S102, this first mask material 42 is used as an ion implantation mask for ion implantation with Al as a p-type impurity into the SiC layer 14 to form the first SiC region (p well region) 16 (FIG. 3).

Figure 4:
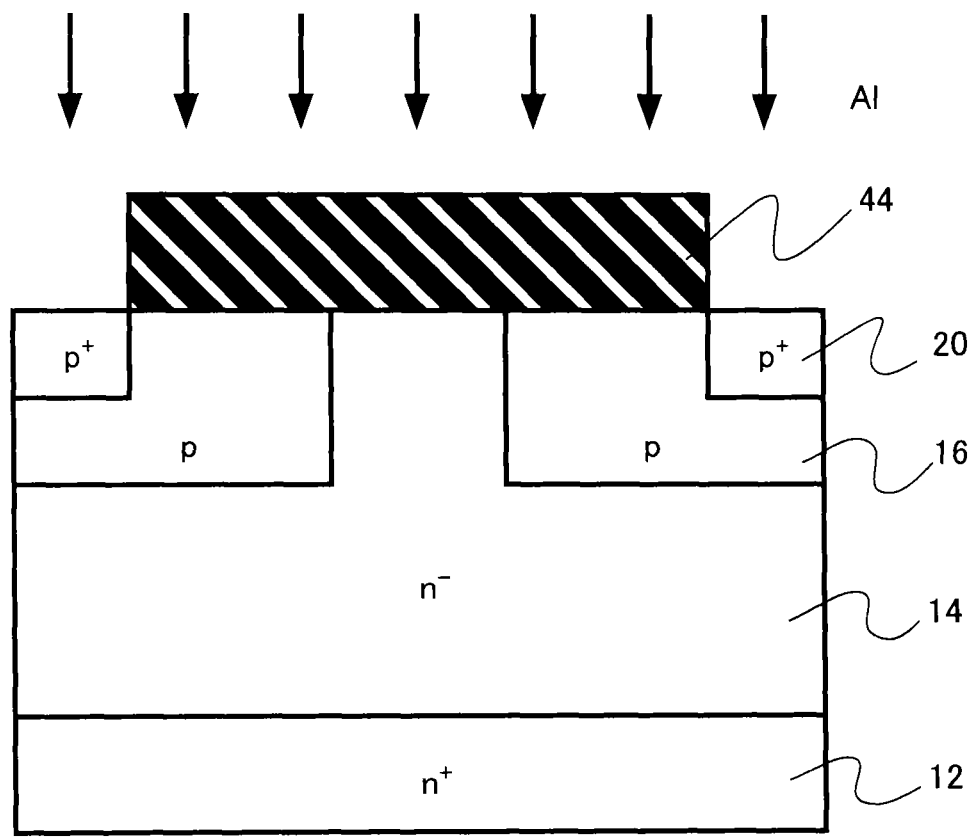
FIG. 4 is a schematic cross-sectional view illustrating a semiconductor device in process of manufacture in the method for manufacturing the semiconductor device according to the first embodiment.

Thereafter, a second mask material 44 of, for example, SiO$_2$ is formed by patterning through photolithography and etching. In step S104, this second mask material 44 is used as an ion implantation mask for ion implantation with Al as a p-type impurity into the SiC layer 14 to form the third SiC region (p well contact region) 20 (FIG. 4).

In step S106, after forming the p well contact region 20, high-temperature anneal is carried out for activating the p-type impurity in the p well region 16 and the p well contact region 20. For this high-temperature anneal, conditions such as heating temperature of 1600° C. or higher and 2000° C. or lower and heating time of 10 minutes or longer and 60 minutes or shorter are used with the use of an inert gas such as, for example, an argon (Ar) gas as an atmosphere gas. In this case, the activation of the impurity introduced into the SiC can be achieved, while the impurity is slightly diffused.

The heat treatment method for high-temperature anneal is not to be considered particularly limited. It is possible to apply any method such as heater heating, lamp anneal, and laser anneal. From the perspective of reduction in process cost, heater heating or lamp anneal is desirable.

Figure 5:
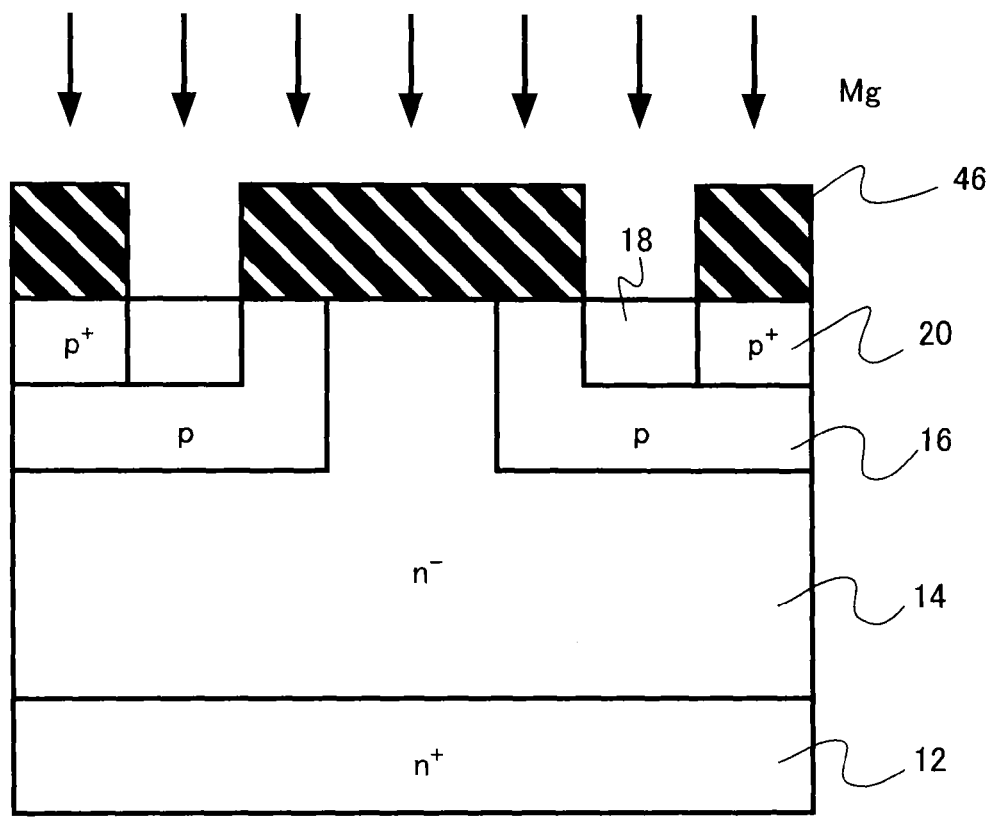
FIG. 5 is a schematic cross-sectional view illustrating a semiconductor device in process of manufacture in the method for manufacturing the semiconductor device according to the first embodiment.

Thereafter, a third mask material 46 of, for example, SiO$_2$ is formed by patterning through photolithography and etching. In step S108, this third mask material 46 is used as an ion injection mask for ion implantation with at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu) into the first SiC region (p well region) 16 (FIG. 5). Hereinafter, a case where the element is Mg will be described as an example.

Figure 6:
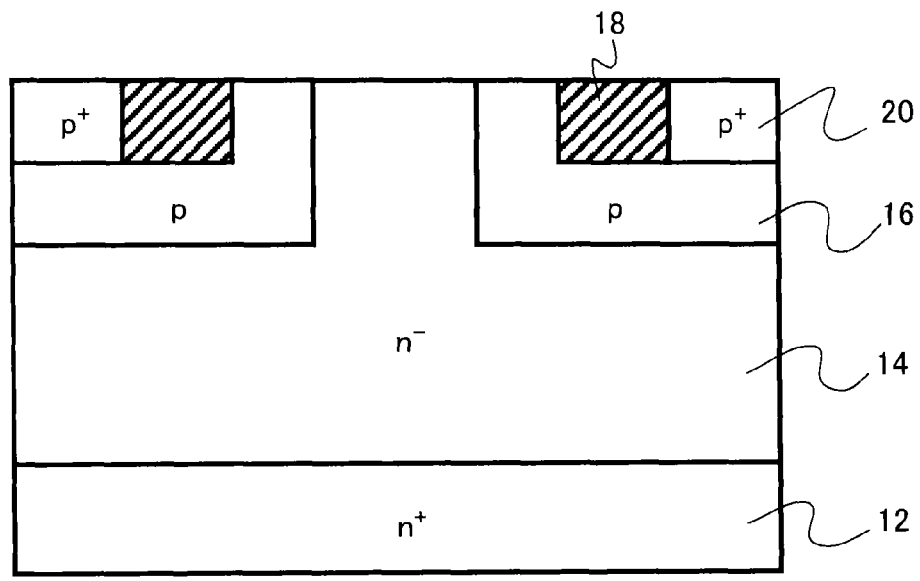
FIG. 6 is a schematic cross-sectional view illustrating a semiconductor device in process of manufacture in the method for manufacturing the semiconductor device according to the first embodiment.

In step S110, after ion implantation with Mg, low-temperature anneal is carried out for metallization of the first SiC region (p well region) 16 with Mg implanted therein. The metallic second SiC region (source region) 18 is formed by the low-temperature anneal (FIG. 6).

This low-temperature anneal is carried out at a lower temperature than that of the high-temperature anneal for activating the p well region 16 and the p well contact region 20. The heat treatment is carried out at a temperature of, for example, 600° C. or higher and lower than 1600° C. The heat treatment temperature is, from the perspective of metallization, desirably 1000° C. or lower, and more desirably 800° C. or lower. The heat treatment is desirably carried out in an inert atmosphere such as a nitrogen gas and an argon gas.

The heat treatment method for low-temperature anneal is not to be considered particularly limited. It is possible to apply any method such as heater heating, lamp anneal, and laser anneal. From the perspective of reduction in process cost, heater heating or lamp anneal is desirable.

Figure 7:
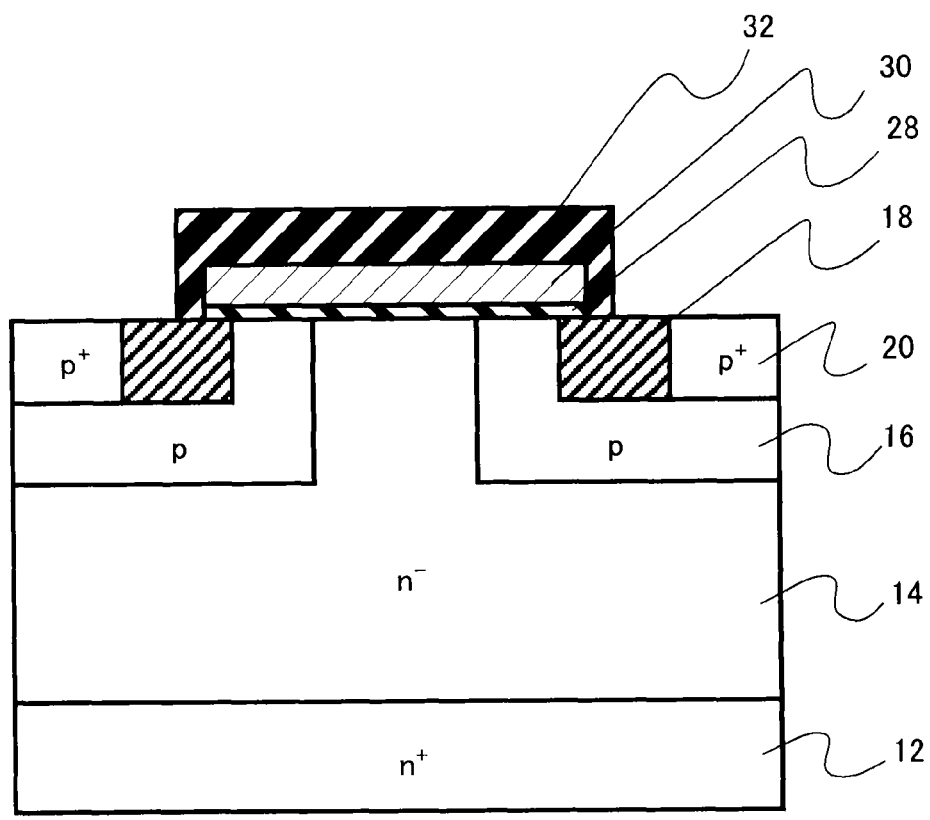
FIG. 7 is a schematic cross-sectional view illustrating a semiconductor device in process of manufacture in the method for manufacturing the semiconductor device according to the first embodiment.

In step S112, the gate insulating film 28 of, for example, a SiO$_2$ film is formed by a CVD (Chemical Vapor Deposition) method or a thermal oxidation method. Then, in step S114, the gate electrode 30 of, for example, polysilicon is formed on the gate insulating film 28. Then, in step S116, the interlayer insulating film 32 of, for example, an SiO$_2$ film is formed on the gate electrode 30 (FIG. 7).

Thereafter, in step S118, the conductive first electrode (source-p well common electrode) 24 is formed on the second SiC region (source region) 18 and the third SiC region (p well contact region) 20. The first electrode (source-p well common electrode) 24 is electrically connected to the second SiC region (source region) 18 and the third SiC region (p well contact region) 20. The first electrode (source-p well common electrode) 24 is formed by sputtering, for example, Ti (titanium) and Al (aluminum).

In step S120, the conductive second electrode (drain electrode) 36 is formed on the side (second surface) of the SiC substrate 12 opposite to the SiC layer 14. The second electrode (drain electrode) 36 is formed by, for example, sputtering Ni.

In step S122, electrode anneal at low temperature is carried out in order to reduce the contact resistance between the first electrode 24 and the second electrode 36. The electrode anneal is carried out at a lower temperature than that for the low-temperature anneal mentioned above, for example, at 300° C. or higher and 500° C. or lower in an argon gas atmosphere.

The MOSFET 100 shown in FIG. 1 is formed by the manufacturing method described above.

The function and advantageous effects of the present embodiment will be described below in detail.

As a result of study through the first-principles calculation made by the inventors, it has become obvious that SiC is metallized by introduction of one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu) into the C (carbon) site of the SiC. On the other hand, it has also become obvious that in the case of the element introduced not at C (carbon) site, but at the Si (silicon) site, SiC is not metallized, but becomes a p-type semiconductor. Hereinafter, a case where the element is magnesium (Mg) will be described as an example.

Figure 8A:
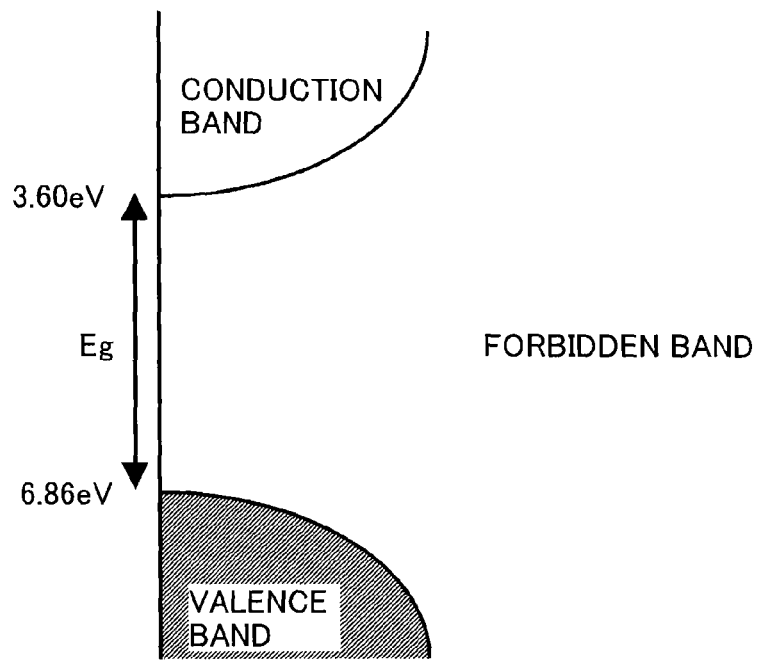
FIGS. 8A and 8B are diagrams illustrating a function in the first embodiment.
Figure 8B:
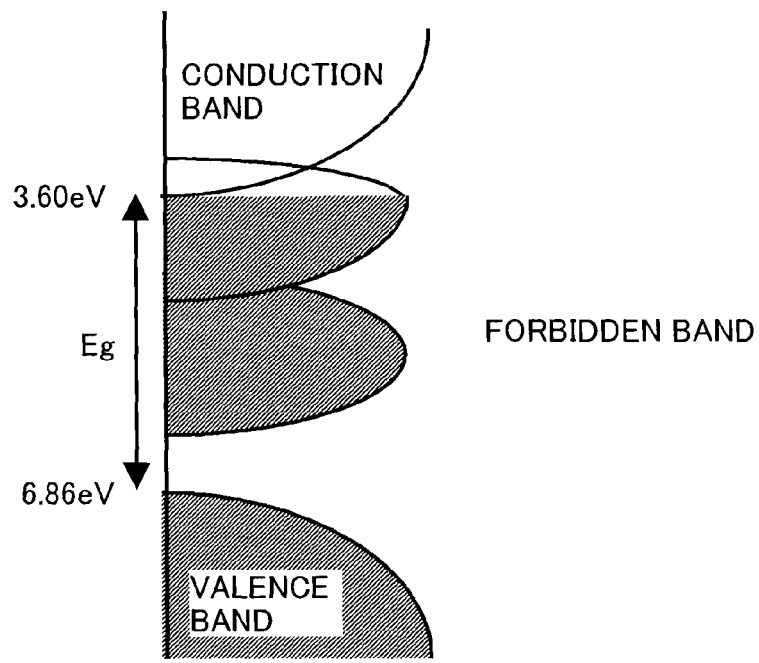

FIGS. 8A and 8B are diagrams showing a function of the first embodiment. FIG. 8A is a band diagram of SiC in the case without containing the element. FIG. 8B is a band diagram in the case of the element introduced into the C (carbon) site. FIGS. 8A and 8E both show level densities and filled states of levels with electrons. The shaded areas in the figures represent states of levels filled with electrons.

According to the first-principles calculation, SiC is metallized by magnesium introduced into the carbon site, and the work function is 3.7 electron volt (eV). This work function is nearly equal to 3.60 electron volt that is potential energy measured from a vacuum level at the lower end of the conduction band of SiC.

This state is achieved in such a way that a level newly formed in the forbidden band of SiC is filled with electrons supplied from magnesium to the level, as shown in FIG. 8B. The level formed in the bandgap of the SiC is believed to be due to dangling bonds of silicon, which are formed by the generation of carbon defects.

The carbon defects are generated by, for example, damage from ion implantation for introducing an impurity into the SiC. When the carbon defects are generated, a vacant level appears near the lower end of the conduction band of the SiC in the forbidden band of the SiC. The supply of electrons from the magnesium introduced into the carbon sites or from the magnesium present between crystal lattices to the vacant level fills the vacant level to metallize the SiC. Because electrons can be also supplied from the magnesium present between crystal lattices, the introduction of magnesium into the carbon sites is not believed to be necessarily essential for the metallization of the SiC.

When magnesium is introduced into the carbon sites, electrons of the magnesium are transferred to dangling bonds of silicon to reduce the size of the magnesium, and relax strain in the crystal lattices.

The magnesium in the SiC is more stably introduced at the silicon sites than at the carbon sites in a state of equilibrium. When magnesium is introduced into the silicon sites, the magnesium forms a deep level, and the SiC becomes a p-type semiconductor as described above.

In order to metallize the SiC by the introduction of magnesium, it is desirable to introduce magnesium by ion implantation to generate large amounts of carbon defects due to damage from the ion implantation. The generation of the carbon defects makes magnesium more likely to be introduced into the carbon sites to inhibit the introduction of magnesium into the silicon sites.

The heat treatment after the ion implantation introduces magnesium into the carbon sites. From the perspective of introducing magnesium into the carbon sites, the heat treatment is desirably at 600° C. or higher, more desirably 700° C. or higher.

In addition, from the perspective of inhibiting the introduction of magnesium into the silicon sites, the heat treatment after the ion implantation is desirably at low temperature. Therefore, the heat treatment is desirably at 1000° C. or lower, and more desirably 800° C. or lower.

While magnesium (Mg) has been illustrated above by an example as the element for metallizing SiC, it has been confirmed that by the first-principles calculation that the same function is also achieved in the case of Ca (calcium), Sr (strontium), Ba (barium), Sc (scandium), Y (yttrium), La (lanthanum), lanthanoid (Ce, Pr, Nd, Pm, Sm, Eu, Gd, Tb, Dy, Ho, Er, Tm, Yb, Lu).

From the perspective of increasing the supply of electrons to the dangling bonds, the element is desirably an element that is more likely to emit electrons, and small in work function in the metallic state. Furthermore, because the lower end of the conduction band of SiC has potential energy of 3.6 eV, the work function is desirably 3.6 eV or less in order to supply electrons to the vacant level generated near the lower end of the conduction band.

Therefore, Ca, Ba, and Sr are desirable which has a smaller work function than 3.7 eV in the case of Mg. The respective work functions thereof are 2.8 eV, 2.6 eV, and 2.6 eV. Among these elements, Ca is more desirable which is small in atomic size and more likely to be introduced into the carbon sites. Just for the record, the work functions of La, lanthanoid, and Sc are all approximately 3.5 eV.

In addition, from the perspective of increasing the supply of electrons to the dangling bonds, an element that is high in terms of valence is desired. From this perspective, trivalent elements are more desirable than divalent elements. Among the trivalent elements, Y is a desirable element, also because of the small work function of 3.1 eV and the small atomic size.

As in MOSFETs, it is important to reduce the ON resistance in a power semiconductor device including a MOS structure. Thus, it is conceivable that a source region is metallized to reduce the parasitic resistance of the source region. However, as compared with Si, SiC has a larger bandgap, and smaller potential energy measured from a vacuum position at the lower end of the conduction band. For this reason, there is no appropriate metallic materials which have such a work function that lowers the barrier between the source region and the channel region. Therefore, it is difficult to metallize the source region to reduce the ON resistance. For example, the Mg, Ca, Ba, Sr, La, lanthanoid, Sc, etc. mentioned above are easily oxidized in the metallic states, and thus high in resistance and inappropriate even if the elements are applied to the source region.

In addition, in the metallization of the source region, a metal film made into silicide, such as, for example, nickel is to be deposited, and subjected to heat treatment to achieve the formation. In this case, carbon cluster is precipitated at the interface between the source region and the p-type channel. Such carbon cluster can cause the resistance between the metallized source region and the p-type channel of SiC to be increased, or cause the film to be peeled in the source region.

In the present embodiment, the metallized SiC is applied to the source region 18 of the vertical MOSFET, as shown in FIG. 1.

FIGS. 9A and 9B are diagrams showing a function of the MOSFET according to the present embodiment. FIG. 9A is a band diagram between the source and drain of the MOS- FET in an OFF state. FIG. 9B is a band diagram between the source region and drain region of the MOSFET in an ON state. The drain is an n-type SiC semiconductor.

As described above, the work function of the metallized SiC is nearly equal to 3.60 electron volt that is potential energy measured from a vacuum level at the lower end of the conduction band of SiC. Accordingly, as shown in FIG. 9, the work function of the source region is nearly equal to potential energy measured from a vacuum level at the lower end of the conduction band of the p-type channel region of SiC.

For this reason, the energy barrier between the source region 18 and the p well region (channel region) 16 is eliminated or extremely reduced in the ON state of the MOSFET 100 as shown in FIG. 9B. Therefore, the MOSFET 100 is achieved which is low in ON resistance. Moreover, because of the steep rising angle of the current with respect to a gate voltage, a quick change can be achieved from the OFF state to the ON state, and switching loss can be reduced.

Further, due to the fact that the source region 18 is metallic, the resistance of the source region 18 itself is reduced to reduce the parasitic resistance of the MOSFET 100. Therefore, also in this regard, the MOSFET 100 is achieved which is low in ON resistance.

Furthermore, the metallized SiC is excellent in oxidation resistance, and able to achieve a low resistance.

Further, as shown in FIG. 9A, the energy barrier between the source region 18 and the p well region (channel region) 16 is increased to 3.26 eV (electron volt), which corresponds to the bandgap of SiC, in the OFF state of the MOSFET 100. Therefore, the MOSFET 100 is achieved which is excellent in cutoff characteristics.

Moreover, in the formation of the source region 18, the boundary between the p well region (channel region) 16 and the source region 18 becomes a continuous interface, thus no carbon cluster is formed. Therefore, the problems of the resistance increased and film peeled at the interface can be avoided which are caused by the formation of carbon cluster.

It is to be noted that in the semiconductor device according to the present embodiment, the concentration of the element in the source region 18 is desirably $1\times10^{18}$ cm$^{-3}$ or more and $1\times10^{22}$ cm$^{-3}$ or less, from the perspective of sufficiently metallizing the source region 18 to reduce the resistance. In the case of less than $1\times10^{18}$ cm$^{-3}$, there is a possibility that adequate electrons will not be supplied from the element. Alternatively, in excess of $1\times10^{22}$ cm$^{-3}$, there is a possibility that strain in SiC will be increased to degrade device characteristics.

Furthermore, the concentration of the element in the source region 18 is further desirably $3\times10^{19}$ cm$^{-3}$ or more and $1\times10^{21}$ cm$^{-3}$ or less. In the case of forming the source region 18 by ion implantation, the dose amount for the ion implantation is desirably adjusted to $1\times10^{13}$ cm$^{-2}$ or more in order to form adequate carbon defects. On the other hand, when the dose amount is excessively increased, there is a possibility that silicon defects will be increased to make the element more likely to be introduced into the silicon defects. Therefore, the dose amount for the ion implantation is desirably $1\times10^{14}$ cm$^{-2}$ or less. When the range of the dose amount is converted into concentration, the concentration is $3\times10^{19}$ cm$^{-3}$ or more and $1\times10^{21}$ cm$^{-1}$ or less.

In addition, from the perspective of reducing the parasitic resistance to reduce the ON resistance of the MOSFET, the sheet resistance of the source region 18 is desirably 0.5Ω/☐ or less. The sheet resistance is more preferably 0.1Ω/☐ or less, and further preferably 0.05Ω/☐ or less. In addition, from the perspective of reducing the barrier between the source region 18 and the p well region 16 to reduce the ON resistance of the MOSFET, the work function of the source region 18 is desirably 3.7 eV (electron volt) or less. The work function is further desirably 3.6 eV (electron volt) or less.

In addition, in the case of a MOSFET that has the source region 18 formed from an n-type semiconductor, it is difficult to form, from one type of metallic material, the source region 18 of n-type semiconductor and a low-resistance simultaneous contact in the p well contact region 20 of p-type semiconductor. This is because of the wide bandgap of the SiC. In the present embodiment, because of the metallic source region 18, a low-resistance simultaneous contact can be easily formed as long as a metal is selected which forms the p well contact region 20 of p-type semiconductor and a low-resistance contact, without considering the contact with the source region 18.

It is to be noted that it is possible to determine whether the source region 18 is metallic or semiconductive, by measuring the temperature dependence of resistivity in the source region 18. In the case of being metallic, the resistance is increased with the increase in temperature. In the case of being semiconductive, the resistance is decreased with the increase in temperature.

Thus, the semiconductor device and manufacturing method therefor according to the present embodiment achieve a high-performance MOSFET which has an ON resistance reduced, steep rising of current, and cutoff characteristics improved. The device and method will achieve not only reduction in conduction loss, but also reduction in switching loss. Furthermore, a MOSFET is achieved which is excellent in reliability with a metallic film prevented from being peeled in a source region.

While an example for the case of Mg has been provided herein, either equaling or surpassing results are produced in the case of Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu). As described previously, the metal is favorably lower in work function, favorably smaller in atomic radius, and favorably larger in valence. The same applies to the following embodiments.

Modification Example

In a semiconductor device according to a modification example of the first embodiment, the n$^-$-type SiC layer 14 in between two channels is partially metallic SiC. This semiconductor device is formed by, for example, ion implantation with Mg or the like into the n$^-$-type SiC layer 14 for two channels. It is possible to form the layer simultaneously in the formation of the source region 18.

The n-type SiC layer 14 on the side of carriers coming out from the channels serve as a JFET (Junction Field Effect Transistor) resistance. However, when this region is turned into a metallized SiC region, the JFET resistance will be reduced. As a result, it is possible to eliminate the JFET resistance itself. When Mg is implanted into greater depth, it is also possible to eliminate the JFET resistance region itself.

It is well known that the JFET resistance is eliminated in MOSFETs of trench structure, DiMOSFET that is low in conduction loss, which is equivalent to the trench structure, can be achieved as long as the JFET region can be turned into a metallic region that is small in work function, as in the present modification example.

Second Embodiment

The method for manufacturing a semiconductor device according to the present embodiment is the same as in the first embodiment, except that the first SiC region is subjected to ion implantation with Si (silicon) before heat treatment, and that the activation of the p well contact region (third SiC region) and the metallization of the source region (second SiC region) are achieved by heat treatment carried out once. Therefore, the contents overlapping with the first embodiment will not be repeated.

Figure 10:
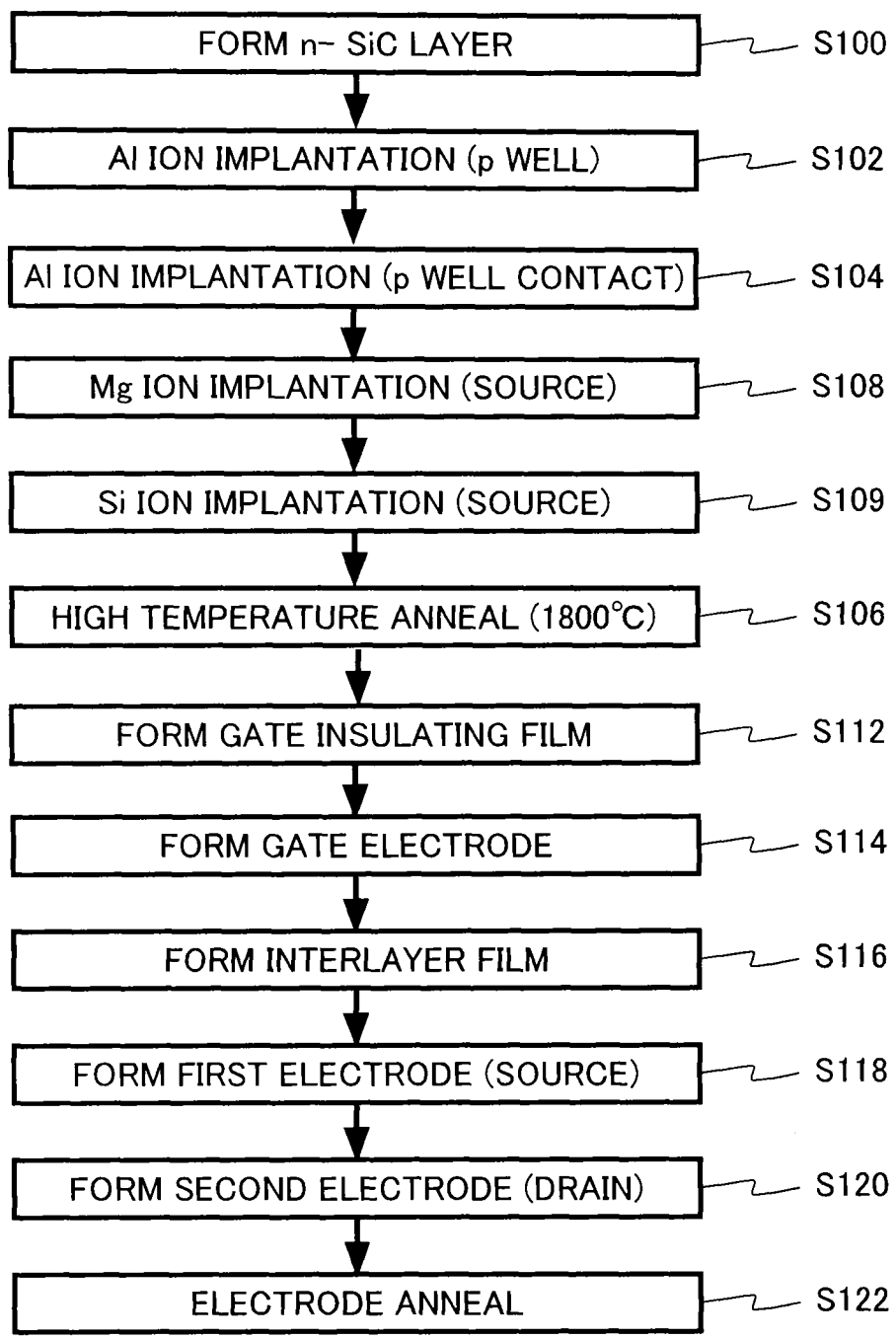
FIG. 10 is a process flow diagram illustrating by example a method for manufacturing a semiconductor device according to a second embodiment.
Figure 11:
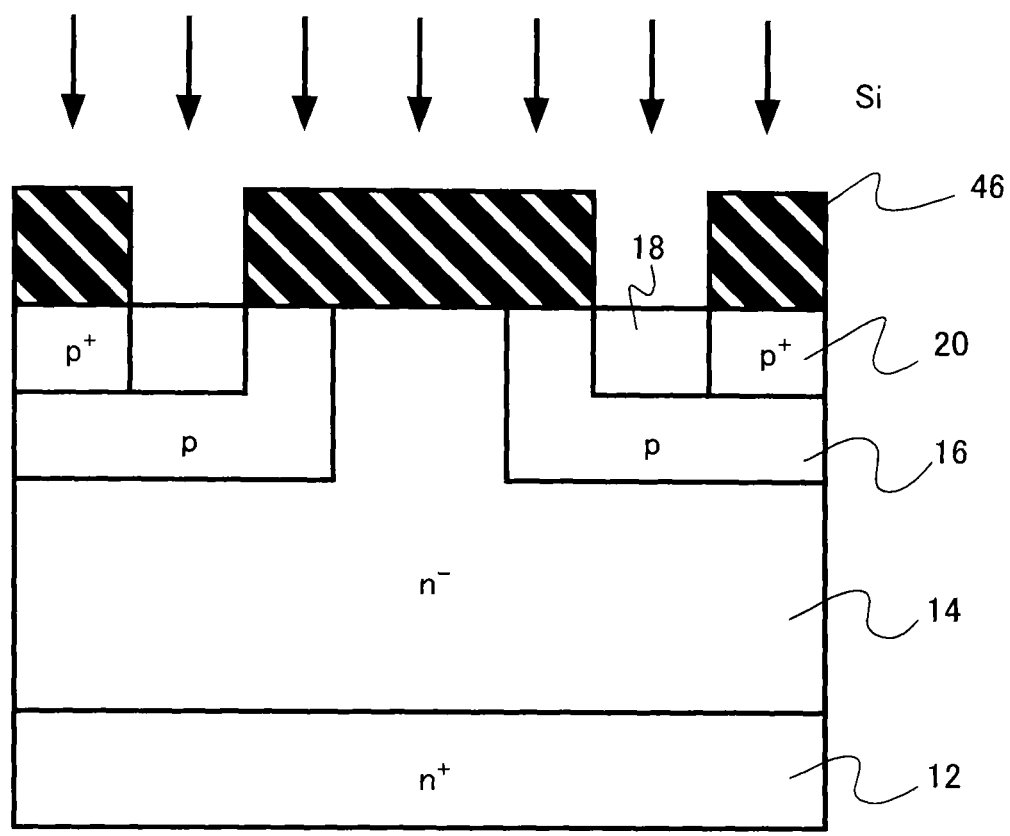
FIG. 11 is a schematic cross-sectional view illustrating a semiconductor device in process of manufacture in the method for manufacturing the semiconductor device according to the second embodiment.

FIG. 10 is a process flow diagram illustrating by example a method for manufacturing a semiconductor device according to the present embodiment. FIG. 11 is a schematic cross-sectional view illustrating the method for manufacturing a semiconductor device according to the present embodiment.

As shown in FIG. 10, the method for manufacturing the semiconductor device includes n⁻ SiC layer formation (step S100), Al ion implantation (step S102), Al ion implantation (step S104), Mg ion implantation (step S108), Si ion implantation (step S109), high-temperature anneal (step S106), gate insulating film formation (step S112), gate electrode formation (step S114), interlayer film formation (step S116), first electrode formation (step S118), second electrode formation (step S120), and electrode anneal (step S122).

The process up to the Al ion implantation (step S104) is the same as in the first embodiment. Thereafter, after carrying out the Mg ion implantation (step S108), Si ion implantation is carried out in step S109 (FIG. 11). In the Si ion implantation, the same mask material 46 as in the Mg ion implantation is used for a mask. It is to be noted that it is also possible to carry out the Si ion implantation (step S109) before the Mg ion implantation (step S108).

In step S106, after the ion implantation with Mg and Si, high-temperature anneal is carried out for the activation of p-type impurities in the p well region 16 and the p well contact region 20 and the metallization of the first SiC region (p well region) 16 with Mg implanted therein. The metallic second SiC region (source region) 18 is formed by the high-temperature anneal.

For this high-temperature anneal, conditions such as heating temperature of 1600° C. or higher and 1850° C. or lower and heating time of 10 minutes or longer and 60 minutes or shorter are used with the use of an inert gas such as, for example, an argon (Ar) gas as an atmosphere gas. In this case, the activation of the impurity introduced into the SiC can be achieved, while the impurity is slightly diffused.

The heat treatment method for high-temperature anneal is not to be considered particularly limited. It is possible to apply any method such as heater heating, lamp anneal, and laser anneal. From the perspective of reduction in process cost, heater heating or lamp anneal is desirable.

The subsequent gate insulating film formation (step S112), gate electrode formation (step S114), interlayer film formation (step S116), first electrode formation (step S118), second electrode formation (step S120), and electrode anneal (step S122) are the same as in the first embodiment.

Figure 12A:
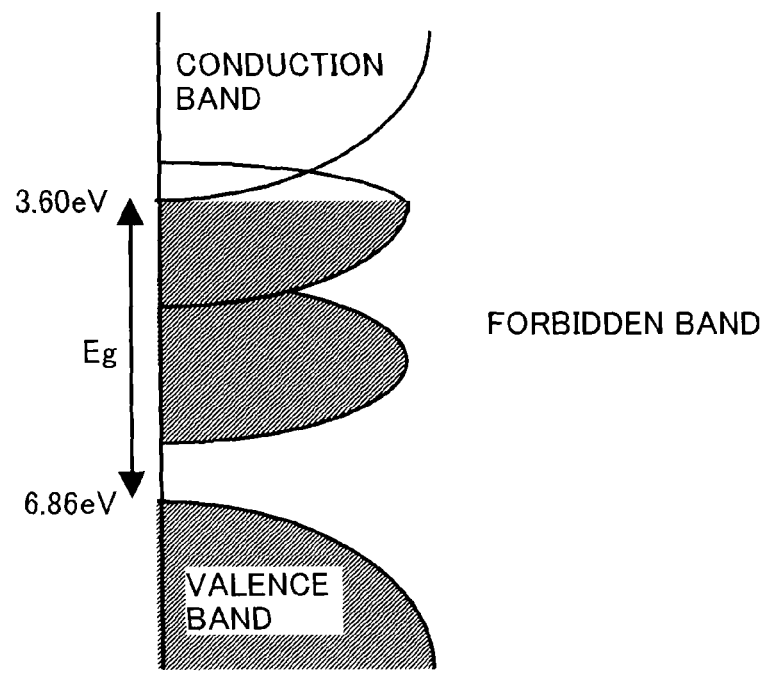
FIGS. 12A and 12B are diagrams illustrating a function in the second embodiment.
Figure 12B:
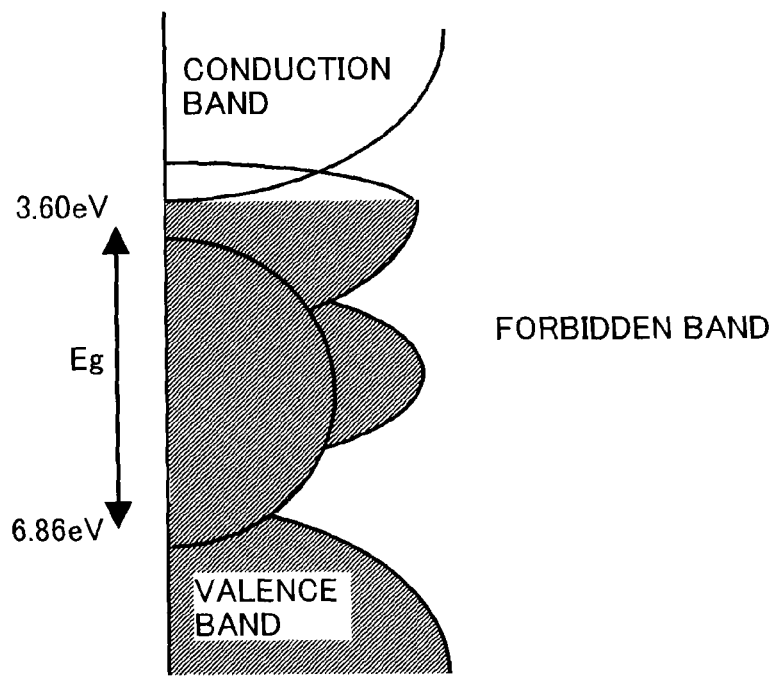

FIGS. 12A and 12B are diagrams showing a function of the present embodiment. Hereinafter, a case where the element is magnesium (Mg) will be described as an example.

FIG. 12A is a band diagram of the SiC according to the first embodiment. FIG. 12B is a band diagram according to the present embodiment. FIGS. 12A and 12B both show level densities and filled states of levels with electrons. The shaded areas in the figures represent states of levels filled with electrons.

According to the first-principles calculation, a new level is further formed in the forbidden band of SiC through the introduction of Si (silicon) as shown in FIG. 12B. This newly formed level is formed so as to fill the gap between a level formed through the introduction of magnesium and the valence band. Accordingly, the resistance of the metallic SiC is further reduced.

In addition, co-doping with Mg and Si makes Mg more likely to be introduced into the carbon sites of SiC rather than the silicon site thereof, due to the effect of site competition. Accordingly, the resistance of the metallic SiC easily becomes lowered.

In addition, the metallic SiC is stable up to a high temperature on the order of 1800° C., because Mg becomes more likely to be introduced into the carbon sites. Accordingly, the anneal for the activation of p-type impurities in the p well region 16 and the p well contact region 20 and the metallization of the first SiC region (p well region) 16 with Mg implanted therein can be achieved by the same high-temperature anneal (step S106).

From the perspective of making Mg more likely to be introduced into the carbon sites of SiC rather than the silicon sites, the dose amount for the ion implantation with Si is desirably five or more times, more desirably ten or more times as large as the dose amount for the ion implantation with Mg.

The method for manufacturing a semiconductor device according to the present embodiment further achieves the lowered resistance of the source region 18, in addition to the same function and advantageous effect as in the first embodiment. Furthermore, the Si ion implantation makes it possible to metallize the source region 18 at high temperature, thereby reducing the manufacturing process.

Third Embodiment

The method for manufacturing a semiconductor device according to the present embodiment is the same as in the first embodiment, except that the p well contact is subjected to N (nitrogen) ion implantation in addition to Al ion implantation, and that the activation of the p well contact region (third SiC region) and the metallization of the source region (second SiC region) are achieved by heat treatment carried out once. Therefore, the contents overlapping with the first embodiment will not be repeated.

Figure 13:
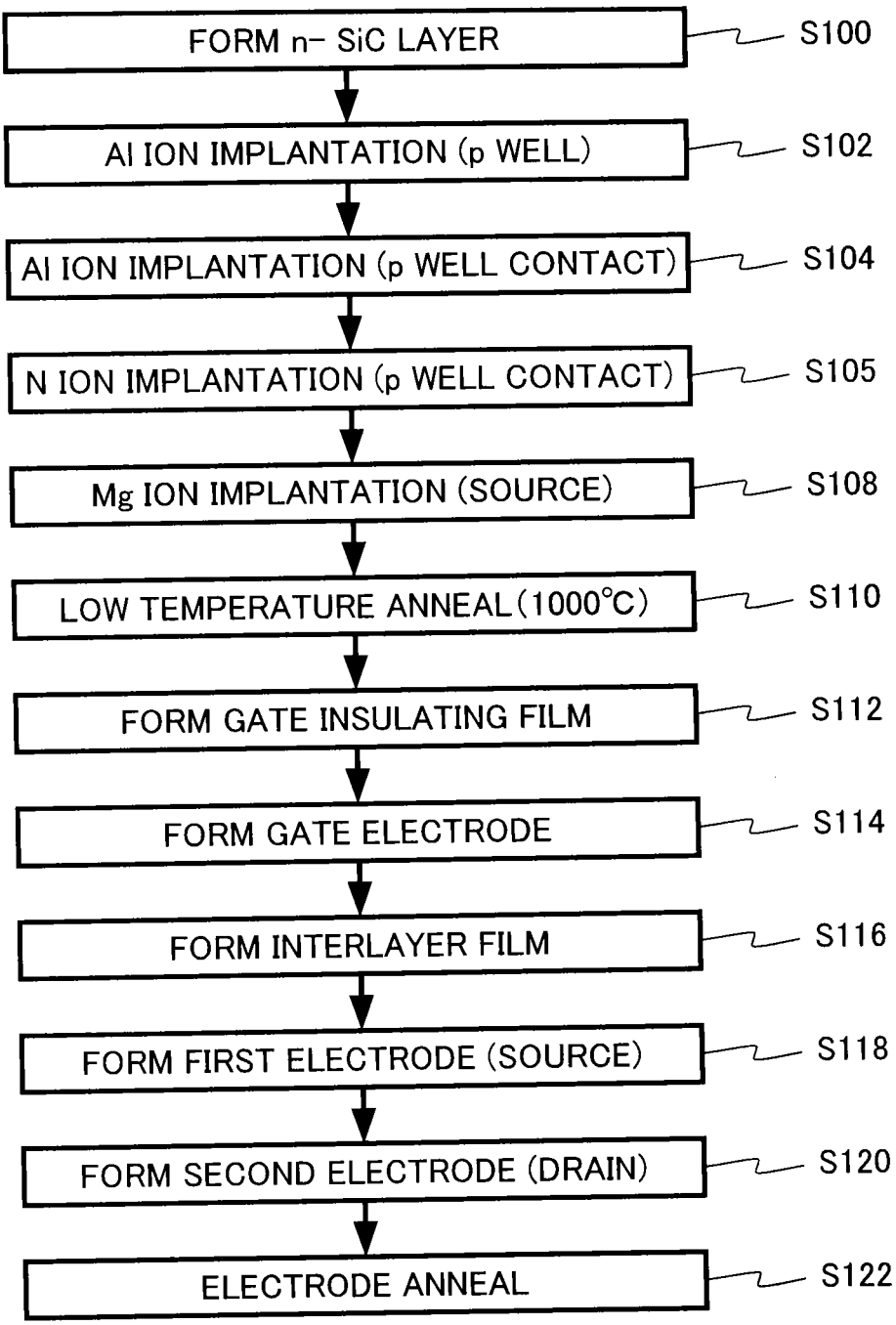
FIG. 13 is a process flow diagram illustrating by example a method for manufacturing a semiconductor device according to a third embodiment.
Figure 14:
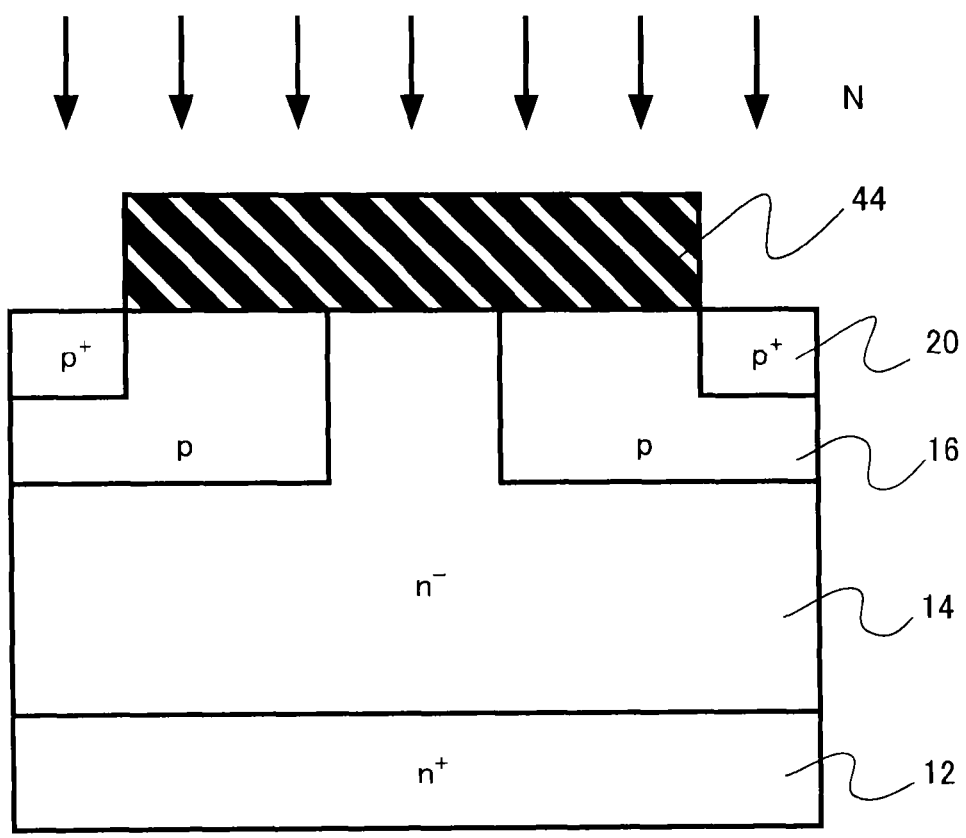
FIG. 14 is a schematic cross-sectional view illustrating a semiconductor device in process of manufacture in the method for manufacturing the semiconductor device according to the third embodiment.

FIG. 13 is a process flow diagram illustrating by example a method for manufacturing the semiconductor device according to the present embodiment. FIG. 14 is a schematic cross-sectional view illustrating the method for manufacturing a semiconductor device according to the present embodiment.

As shown in FIG. 13, the method for manufacturing the semiconductor device includes n⁻ SiC layer formation (step S100), Al ion implantation (step S102), Al ion implantation (step S104), N ion implantation (step S105), Mg ion implantation (step S108), low-temperature anneal (step S110), gate insulating film formation (step S112), gate electrode formation (step S114), interlayer film formation (step S116), first electrode formation (step S118), second electrode formation (step S120), and electrode anneal (step S122).

The process up to the Al ion implantation (step S104) is the same as in the first embodiment. Thereafter, in step S105, N (nitrogen) ion implantation is carried out (FIG. 14). In the N ion implantation, the same mask material 44 as in the Al ion implantation in step S104 is used for a mask.

It is to be noted that it is also possible to carry out the N ion implantation (step S105) before the Al ion implantation (step S104).

Then, Mg ion implantation (step S108) is carried out after the N ion implantation (step S105).

In step S110, after the ion implantation with Mg, low-temperature anneal is carried out for the activation of p-type impurities in the p well region 16 and the p well contact region 20 and the metallization of the first SiC region (p well region) 16 with Mg implanted therein. The metallic second SiC region (source region) 18 is formed by the low-temperature anneal.

For this low-temperature anneal, the heat treatment is carried out at a temperature of, for example, 600° C. or higher and lower than 1600° C. The heat treatment temperature is, from the perspective of metallization, desirably 1000° C. or lower, and more desirably 800° C. or lower. The heat treatment is desirably carried out in an inert atmosphere such as a nitrogen gas and an argon gas.

The heat treatment method for low-temperature anneal is not to be considered particularly limited. It is possible to apply any method such as heater heating, lamp anneal, and laser anneal. From the perspective of reduction in process cost, heater heating or lamp anneal is desirable.

Next, a function of the present embodiment will be described. As a result of study through the first-principles calculation made by the inventors, it has become obvious that when a p-type semiconductor is co-doped with Al and N, extra Al is introduced into Si sites near Al—N pair structures to provide trimers of Al—N—Al for stabilization. In other words, when a p-type semiconductor is co-doped with Al and N, it is possible to activate Al at low temperature, as compared with a case of doping without N.

Accordingly, according to the present embodiment, the anneal for the activation of p-type impurities in the p well region 16 and the p well contact region 20 and the metallization of the first SiC region (p well region) 16 with Mg implanted therein can be achieved by the same low-temperature anneal (step S110).

The method for manufacturing a semiconductor device according to the present embodiment makes it possible to activate the p well contact region 20 at low temperature by co-doping with Al and N, thereby reducing the manufacturing process.

It is to be noted that in the co-doping, the ratio of the dose amount for the N ion implantation (S105) to the dose amount for the Al ion implantation (S104) is desirably more than 0.40 and less than 0.95, from the perspective of lowering the anneal temperature. Further, the ratio is more desirably 0.45 or more and 0.75 or less. Furthermore, the ratio is further desirably 0.47 or more and 0.60 or less.

Fourth Embodiment

The semiconductor device according to the present embodiment is the same as in the first embodiment, except that the device is a so-called trench MOSFET with a gate insulating film and a gate electrode formed in a trench. Therefore, the contents overlapping with the first embodiment will not be repeated.

Figure 15:
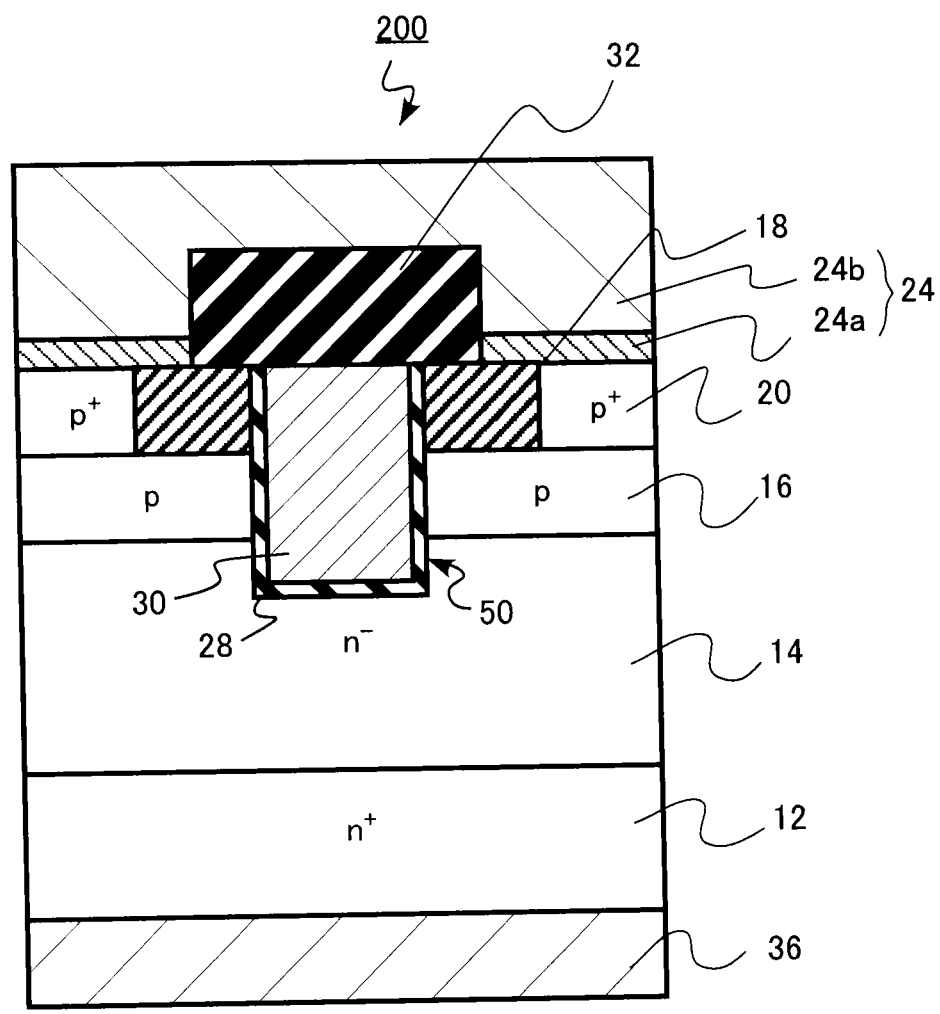
FIG. 15 is a schematic cross-sectional view illustrating a semiconductor device according to a fourth embodiment.

FIG. 15 is a schematic cross-sectional view illustrating the configuration of a MOSFET that is a semiconductor device according to the present embodiment.

As shown in FIG. 15, a MOSFET 200 according to the present embodiment has a gate insulating film 28 and a gate electrode 30 formed in a trench 50 that has one end located on a second SiC region (source region) 18 and the other end located on an n⁻-type Sic layer (drift layer) 14. The gate insulating film 28 is in contact with the drift layer 14, the p well region 16, and the source region 18. In addition, it is also possible to make the p well contact region 20 deeper than the p well region 16.

Also in the present embodiment, a high-performance MOSFET is achieved which has an ON resistance reduced and cutoff characteristics improved as in the case of the first embodiment. Furthermore, a MOSFET is achieved which is excellent in reliability with a metallic film prevented from being peeled in a source region.

Furthermore, the channel length can be shortened through the use of the improved cutoff characteristics. Therefore, it is possible to achieve a MOSFET which has an ON resistance further reduced. It is to be noted that the reduced channel length of the trench MOSFET can be achieved by reducing the thickness of the p well region 16.

Fifth Embodiment

The semiconductor device according to the present embodiment is the same as in the first embodiment, except that the semiconductor substrate is not an n-type semiconductor, but a p-type semiconductor, that is, not a MOSFET but an IGBT. Therefore, the contents overlapping with the first embodiment will not be repeated.

Figure 16:
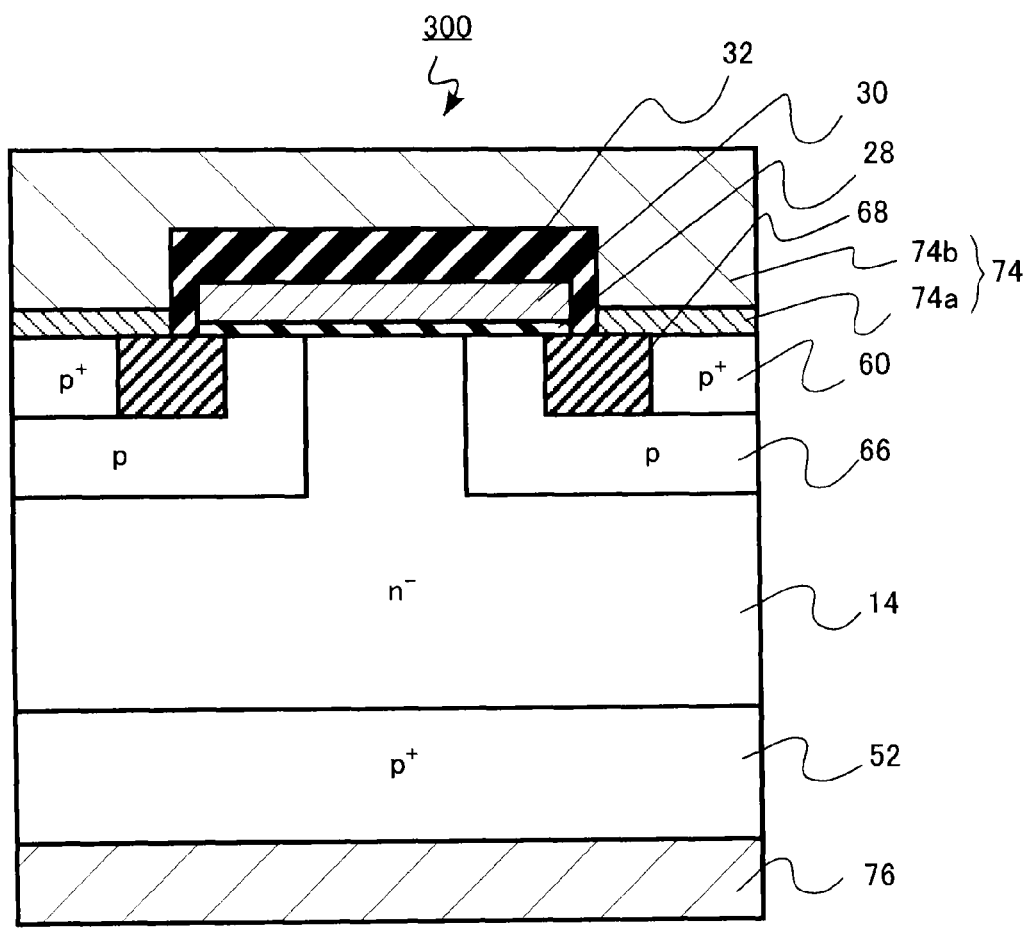
FIG. 16 is a schematic cross-sectional view illustrating a semiconductor device according to a fifth embodiment.

FIG. 16 is a schematic cross-sectional view illustrating the configuration of an IGBT that is a semiconductor device according to the present embodiment.

An IGBT 300 according to the present embodiment includes a SiC substrate 52 of p⁺-type semiconductor, which has first and second surfaces. This SiC substrate 52 is, for example, a SiC substrate of 4H—SiC, which contains, for example, Al (aluminum) as a p-type impurity at an impurity concentration of $1\times10^{18}$ cm$^{-3}$ or more and $1\times10^{20}$ cm$^{-3}$ or less.

On the first surface of the SiC substrate 12, an n⁻-type SiC layer (drift layer) 14 is formed which has, for example, an n-type impurity at an impurity concentration of $5\times10^{15}$ cm$^{-3}$ or more and $2\times10^{16}$ cm$^{-3}$ or less. The drift layer 14 has a film thickness of, for example, 5 µm or more and 50 µm or less.

On a partial surface of the drift layer 14, a p-type first SiC region (p base region) 66 is formed which has, for example, a p-type impurity at an impurity concentration of $5\times10^{15}$ cm$^{-3}$ or more and $1\times10^{17}$ cm$^{-3}$ or less. The p base region 66 is in contact with the drift layer 14.

The p base region 66 has a depth, for example, on the order of 0.6 µm. The p base region 66 functions as a channel region of the IGBT 300.

On a partial surface of the p base region 66, a metallic second SiC region (emitter region) 68 is formed which contains at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu). The emitter region 68 is in contact with the p base region 66. The emitter region 68 has a depth, for example, on the order of 0.3 µm, which is shallower than the depth of the p base region 66.

Furthermore, on a partial surface of the p base region 66 and a side surface of the emitter region 68, a p⁺-type third SiC region (p base contact region) 60 is formed which has, for example, a p-type impurity at an impurity concentration of $1\times10^{18}$ cm$^{-3}$ or more and $1\times10^{22}$ cm$^{-3}$ or less. The p base contact region 60 is in contact with the p base region 66. The p base contact region 60 has a depth, for example, on the order of 0.3 µm, which is shallower than the depth of the p base region 66.

The IGBT has the gate insulating film 28 formed continuously on the surfaces of the drift layer 14 and p base region 66 so as to cover the layer and the region. The gate insulating film 28 is in contact with the drift layer 14 and the p base region 66. For example, a $SiO_2$ film or a high-k insulating film is applicable to the gate insulating film 28.

Further, the gate electrode 30 is formed on the gate insulating film 28. For example, polysilicon or the like is applicable to the gate electrode 30. An interlayer insulating film 32 formed from, for example, a $SiO_2$ film is formed on the gate electrode 30.

The p base region 66 sandwiched between the emitter region 68 and drift layer 14 under the gate electrode functions as a channel region of the IGBT 300.

Further, on the emitter region 68 and the p base contact region 60, a conductive emitter electrode (first electrode) 74 is provided which is electrically connected to the emitter region 68 and the p base contact region 60. The emitter electrode 74 also functions as a p base electrode that imparts an electric potential to the p base region 66.

The emitter electrode 74 is composed of, for example, a Ti (titanium) barrier metal layer 74a and an Al (aluminum) metal layer 74b on the barrier metal layer 74a. The Ti barrier metal layer 74a and the Al metal layer 74b may react to form an alloy.

Furthermore, a conductive collector electrode (second electrode) 76 is formed on the side of the SiC substrate 52 opposite to the drift layer 14, that is, on the second surface. The collector electrode 76 is electrically connected to the SiC substrate 52.

The collector electrode 76 is, for example, Ni (nickel). The collector electrode 76 has a film thickness of, for example, 1 µm or more and 10 µm or less.

It is to be noted that the method for manufacturing the IGBT 300 according to the present embodiment is the same as in the first embodiment, except that the SiC substrate 52 of $p^+$-type semiconductor is used for a semiconductor substrate.

The IGBT undergoes an approximately double-digit increase in electric current flowing therethrough, as compared with the MOSFET. For this reason, the reduction in parasitic resistance is more important, as compared with the MOSFET.

In the present embodiment, the metallized SiC is applied to the emitter region 68 of the vertical IGBT, as shown in FIG. 16. This significantly reduces the parasitic resistance caused by the emitter region 68. Accordingly, the reduction in ON resistance is achieved.

Thus, the semiconductor device and manufacturing method therefor according to the present embodiment achieve a high-performance IGBT which has an ON resistance reduced, steep rising of current, and cutoff characteristics improved. The device and method will achieve not only reduction in conduction loss, but also reduction in switching loss. Furthermore, a IGBT is achieved which is excellent in reliability with a metallic film prevented from being peeled in an emitter region.

Thus, while cases of 4H—SiC have been illustrated by an example as the crystal structure of the silicon carbide in the embodiments, it is also possible to apply the present disclosure to silicon carbides of other crystal structure such as 6H—SiC and 3C—SiC.

While certain embodiments have been described, these embodiments have been presented by way of example only, and are not intended to limit the scope of the inventions. Indeed, the semiconductor device and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   an n-type SiC layer provided on one side of the semiconductor substrate;
   a p-type first SiC region provided in the n-type SiC layer;
   a metallic second SiC region provided in the p-type first SiC region, the metallic second SiC region comprising at least one element selected from the group of Mg (magnesium), Ca (calcium), Sr (strontium), Ba (barium), Sc (scandium), Y (yttrium), La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium);
   a gate electrode;
   a gate insulating film provided between the gate electrode and the n-type SiC layer, the gate insulating film provided between the gate electrode and the first SiC region;
   a first electrode provided on the metallic second SiC region; and
   a second electrode provided on a side of the semiconductor substrate opposite to the n-type SiC layer,
   wherein the metallic second SiC region comprising the at least one element is directly under the gate insulating film.

2. The device according to claim 1, wherein a concentration of the at least one element in the metallic second SiC region is $1\times10^{18}$ $cm^{-3}$ or more and $1\times10^{22}$ $cm^{-3}$ or less.

3. The device according to claim 1, wherein the metallic second SiC region comprises the at least one element selected from the group of Ca (calcium), Sr (strontium), Ba (barium), and Y (yttrium).

4. The device according to claim 1, wherein the metallic second SiC region has a sheet resistance of 0.5Ω/□ or less.

5. The device according to claim 1, wherein the metallic second SiC region has a work function of 3.7 eV or less.

6. The device according to claim 1, further comprising a p-type third SiC region provided between the first SiC region and the first electrode.

7. The device according to claim 1, wherein the semiconductor substrate is an n-type semiconductor.

8. The device according to claim 1, wherein the semiconductor substrate is a p-type semiconductor.

9. A method of manufacturing a semiconductor device, comprising:
   forming an n-type SiC layer on one side of a semiconductor substrate;
   forming a p-type first SiC region by ion implanting a p-type impurity into the n-type SiC layer;
   forming a gate insulating film on the n-type SiC layer and the first SiC region;
   forming a gate electrode on the gate insulating film;
   ion implanting at least one element selected from the group of Mg (magnesium), Ca (calcium), Sr (strontium), Ba (barium), Sc (scandium), Y (yttrium), La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium) into the first SiC region;

forming a second metallic SiC region after the ion implanting of the at least one element, the second metallic SiC region being formed by a heat treatment, the heat treatment metallizing a portion of the first SiC region where the at least one element being implanted;

forming a first electrode on the metallic second SiC region; and forming a second electrode on a side of the semiconductor substrate opposite to the n-type SiC layer; and wherein the metallic second SiC region comprising the at least one element is directly under the gate insulating film.

10. The method according to claim 9, further comprising ion implanting Si (silicon) before the heat treatment, Si (silicon) being implanted into a portion of the first SiC region where the at least one element to be implanted.

11. The method according to claim 9, further comprising forming a p-type third SiC region, the p-type third SiC region being formed by ion implantation of p-type impurity into the first SiC region, wherein the first electrode is formed on the third SiC region.

12. The method according to claim 9, further comprising forming a p-type third SiC region before the heat treatment, the p-type third SiC region being formed by ion implantation of Al (aluminum) and N (nitrogen) into the first SiC region.

* * * * *